United States Patent
Rofougaran (10) Patent No.: US 8,249,573 B2
(45) Date of Patent: Aug. 21, 2012

(54) METHOD AND SYSTEM FOR SOFTWARE DEFINED POWER AMPLIFIER FOR MULTI-BAND APPLICATIONS

(75) Inventor: Ahmadreza Rofougaran, Newport Coast, CA (US)

(73) Assignee: Broadcom Corporation, Irvine, CA (US)

(*) Notice: Subject to any disclaimer, the term of this patent is extended or adjusted under 35 U.S.C. 154(b) by 1474 days.

(21) Appl. No.: 11/678,984

(22) Filed: Feb. 26, 2007

(65) Prior Publication Data

US 2008/0205547 A1 Aug. 28, 2008

Related U.S. Application Data

(63) Continuation-in-part of application No. 11/648,825, filed on Dec. 29, 2006, now Pat. No. 7,973,730.

(51) Int. Cl.
*H04M 3/00* (2006.01)
*H04B 1/38* (2006.01)

(52) U.S. Cl. ............... 455/418; 455/90.3; 455/419

(58) Field of Classification Search .......... 343/861, 343/787; 330/285, 10, 295, 296; 363/21.01; 455/232.1, 127.3, 475.7, 90.3, 22, 105, 168.1, 455/562, 561, 447; 375/376, 375

See application file for complete search history.

(56) References Cited

U.S. PATENT DOCUMENTS

| 6,172,884 B1* | 1/2001 | Lanni ................... 363/21.05 |
| 7,508,898 B2* | 3/2009 | Cyr et al. ................ 375/376 |
| 7,546,093 B2* | 6/2009 | Kim ..................... 455/90.3 |
| 2004/0008081 A1* | 1/2004 | Friedel et al. ............. 330/10 |
| 2007/0096823 A1* | 5/2007 | Wang et al. ............. 330/285 |
| 2008/0122723 A1* | 5/2008 | Rofougaran ............. 343/861 |
| 2008/0158081 A1* | 7/2008 | Rofougaran ............. 343/787 |

* cited by examiner

*Primary Examiner* — Kiet Doan
(74) *Attorney, Agent, or Firm* — Farjami & Farjami LLP (57) ABSTRACT

Methods and systems for software definition of a power amplifier for multi-band applications are disclosed and may comprise configuring a single programmable output stage of a transmitter to transmit a signal via one of a plurality of selectively coupled antennas, wherein each antenna handles signals in a different frequency band. A power amplifier within the single programmable output stage may be tuned to a frequency within a range of frequencies handled by the selectively coupled antenna. The tuning may be accomplished by programmably adjusting at least one inductance and capacitance. The antennas may be impedance matched to the power amplifier using transformers and may be activated by at least one integrated transistor. The power amplifier may be biased in a class of operation, which may include Class A, AB, C and F, and may be biased utilizing a digitally-controlled current source and a digitally-controlled voltage source.

21 Claims, 5 Drawing Sheets

METHOD AND SYSTEM FOR SOFTWARE DEFINED POWER AMPLIFIER FOR MULTI-BAND APPLICATIONS

CROSS-REFERENCE TO RELATED APPLICATIONS/INCORPORATION BY REFERENCE

The present application is a continuation-in-part of application Ser. No. 11/648,825, filed on Dec. 29, 2006 now U.S. Pat. No. 7,973,730. This application also makes reference to:
U.S. Pat. No. 7,729,683 filed on Feb. 26, 2007;
U.S. Pat. No. 7,616,941 filed on Feb. 26, 2007;
U.S. patent application Ser. No. 11/678,990 filed on Feb. 26, 2007; and
U.S. patent application Ser. No. 11/679,003 filed on Feb. 26, 2007.

Each of the above stated applications is hereby incorporated herein by refrence in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to power amplifiers. More specifically, certain embodiments of the invention relate to a method and system for a software defined power amplifier (PA) for multi-band applications.

BACKGROUND OF THE INVENTION

A power amplification circuit in a wireless system is typically a large signal device. In wireless local area network (WLAN) systems, the power amplifier (PA) circuit may be required to transmit output signals at power levels ranging from −50 dBm to +30 dBm, for example. In such WLAN systems, which may, for example, utilize a wide range of modulation types from binary phase shift keying (BPSK) to 512 level quadrature amplitude modulation (512-QAM), output power levels may vary widely such that the ratio of the peak power level to the average power level may be large, for example, 10 dBm to 15 dBm.

The power output of a PA may be affected by the impedance of the antenna. The output impedance of a properly designed PA is matched to the impedance of the antenna. If for some reason the antenna impedance changes, this may cause a reflection in the signal at the antenna back to the PA, which is known as voltage standing wave ratio (VSWR). For example, if a hand or other object is placed on an antenna, the impedance of the antenna may change. With a VSWR of greater than 1, the output power of the PA may vary as gain control circuitry attempts to compensate for the output voltage swing due the reflected signal. One current approach utilized in an attempt to reduce VSWR is with external discrete directional couplers.

Limitations in the performance of PA circuitry may be exacerbated when the PA is integrated in a single integrated circuit (IC) device with other radio frequency (RF) transmitter circuitry [such as digital to analog converters (DAC), low pass filters (LPF), mixers, and RF programmable gain amplifiers (RFPGA)]. Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification. Requirements for AM-AM and/or AM-PM distortion levels as set forth in a WLAN standard, such as IEEE 802.11, may preclude transmitting output signals at high output power levels for PA circuitry that is fabricated utilizing a 65 nm CMOS process, for example.

Wireless systems are typically designed to function at a specific frequency, 900 MHz or 1.8 GHz, for example, and utilizing a defined standard such as GSM, WCDMA, EDGE, for example. Thus, wireless systems have to be designed for a specific application with device performance optimized for that application.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a software defined power amplifier for multi-band applications, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a software defined power amplifier for multi-band applications. Exemplary aspects of the invention may comprise configuring a single programmable output stage of a transmitter to transmit a signal via one of a plurality of selectively coupled antennas, wherein each antenna handles signals in a different frequency band. A power amplifier within the single programmable output stage may be tuned to a frequency within a range of frequencies handled by the selectively coupled antenna. The tuning may be accomplished by programmably adjusting at least one inductance and capacitance. The antennas may be impedance matched to the power amplifier using transformers and may be activated by at least one integrated transistor. The power amplifier may be biased for a particular class of operation, which may include Class A, AB, C and F, and may be biased utilizing a digitally-controlled current source and a digitally-controlled voltage source.

Figure 1A:
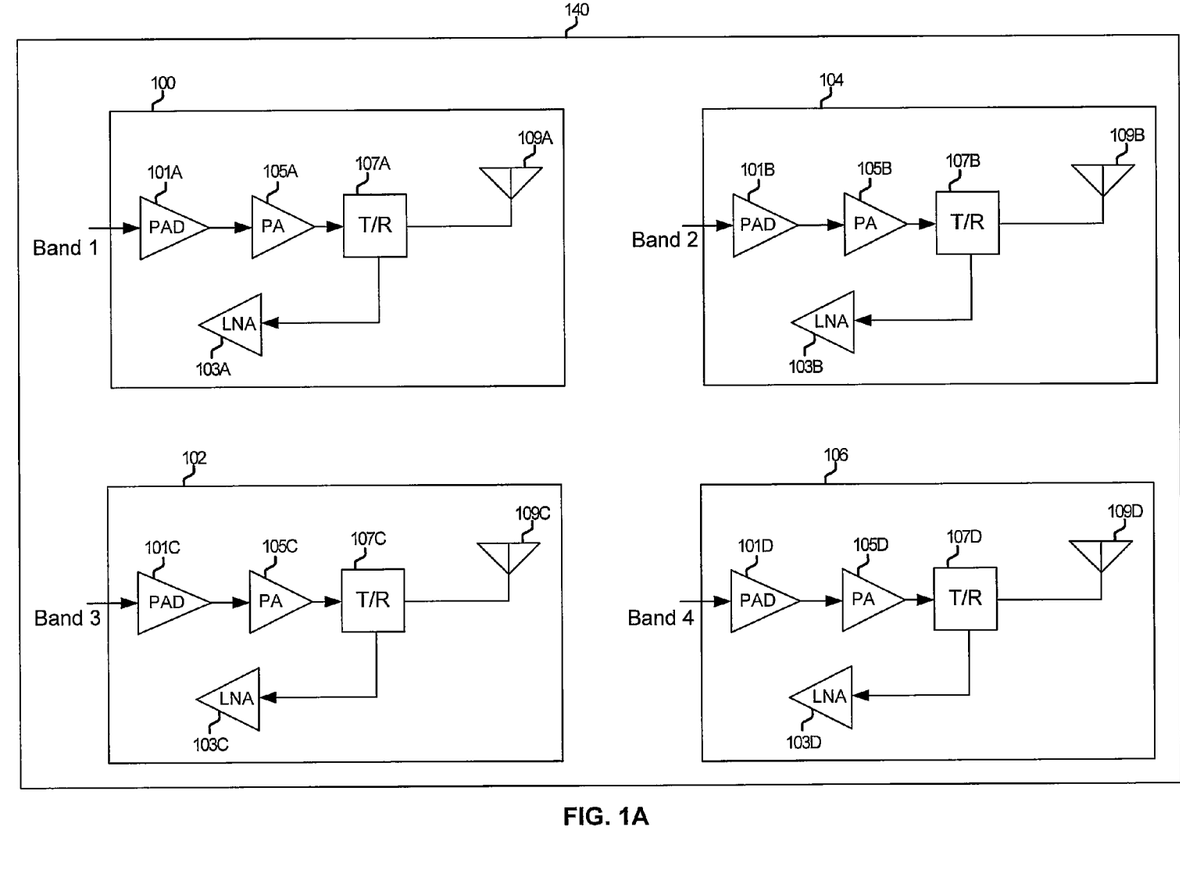
FIG. 1A is a block diagram illustrating exemplary transmitter output stages for different frequency bands, in connection with an embodiment of the invention.

FIG. 1A is a block diagram illustrating exemplary transmitter output stages for different frequency bands, in connection with an embodiment of the invention. Referring to FIG. 1A, there is shown mobile terminal 140 comprising transmitter output stages 100, 102, 104 and 106. The output stage 100 may comprise a power amplifier driver (PAD) 101A, a power amplifier (PA) 105A, a low noise amplifier (LNA) 103A, a transmit/receive (T/R) switch 107A and an antenna 109A.

The PAD 101A may comprise suitable circuitry, logic and/ or code for receiving analog input signals and generating an output signal for driving a power amplifier. The PAD 101A may receive as inputs, control signals, which may be generated by a baseband processor, not shown. The received control signal may be utilized to set a gain or attenuation level of the PAD 101A. The PAD 101A may be enabled to receive the output signal generated by the baseband stages of the transmitter. The PAD 101A may be enabled to generate an output signal that may be communicated to the PA 105A.

The PA 105A may comprise suitable circuitry, logic and/or code that may enable amplification of input signals to generate a transmitted signal of sufficient signal power (as measured by dBm, for example) for transmission via a wireless communication medium. The PA 105A may receive as inputs, control signals, which may be generated by a baseband processor. The received control signal may be utilized to set a gain or attenuation level of the PA 105A.

The LNA 103A may comprise suitable circuitry, logic and/or code that may enable amplification of received signals to generate a signal of sufficient signal for processing by subsequent stages of a receiver circuit, not shown. The LNA 103A may receive a signal received by the antenna 109A via the T/R switch 107A.

The T/R switch 107A may comprise suitable circuitry, logic and/or code for switching the antenna 109A between receiving a signal from the PA 107A and communicating a signal to the LNA 103A. The antenna 109A may comprise suitable circuitry for transmitting an RF signal.

The output stages 102, 104 and 106 may be substantially similar to the output stage 100, but with each output stage designed to transmit and receive at a particular frequency. The amplifier blocks, PAD 101B, 101C and 101D, and PA 105A, 105B, 105C and 105D may function only at a frequency defined by the load impedances of each stage, thus illustrating the limitation of conventional systems: for any desired frequency, a different output stage may be required.

In operation, the output stage 100 may be intended for receiving an analog input signal and applying an appropriate gain to the signal such that the power transmitted by the antenna 109A may be at a desired level. The input signal may be at a particular frequency for which the output stage 100 may be designed. The signal may be communicated to the PAD 101A, which may provide gain or attenuation at a level determined by the required signal to be transmitted by the antenna 109A. The output signal of the PAD 101A may be communicated to the PA 105A. The PA 105A may provide gain or attenuation at a level determined by the required signal to be transmitted by the antenna 109A. The output signal of the PA 105A may be communicated to the input of the T/R switch 107A. The T/R switch 107A may couple the antenna 109A to the PA 105A when in transmit mode, or the LNA 103A, when in receive mode. In transmit mode, the T/R switch 109A may couple the PA 105A to the antenna 109A, such that the output signal received from the PA 105A may be transmitted by the antenna 109A.

Figure 1B:
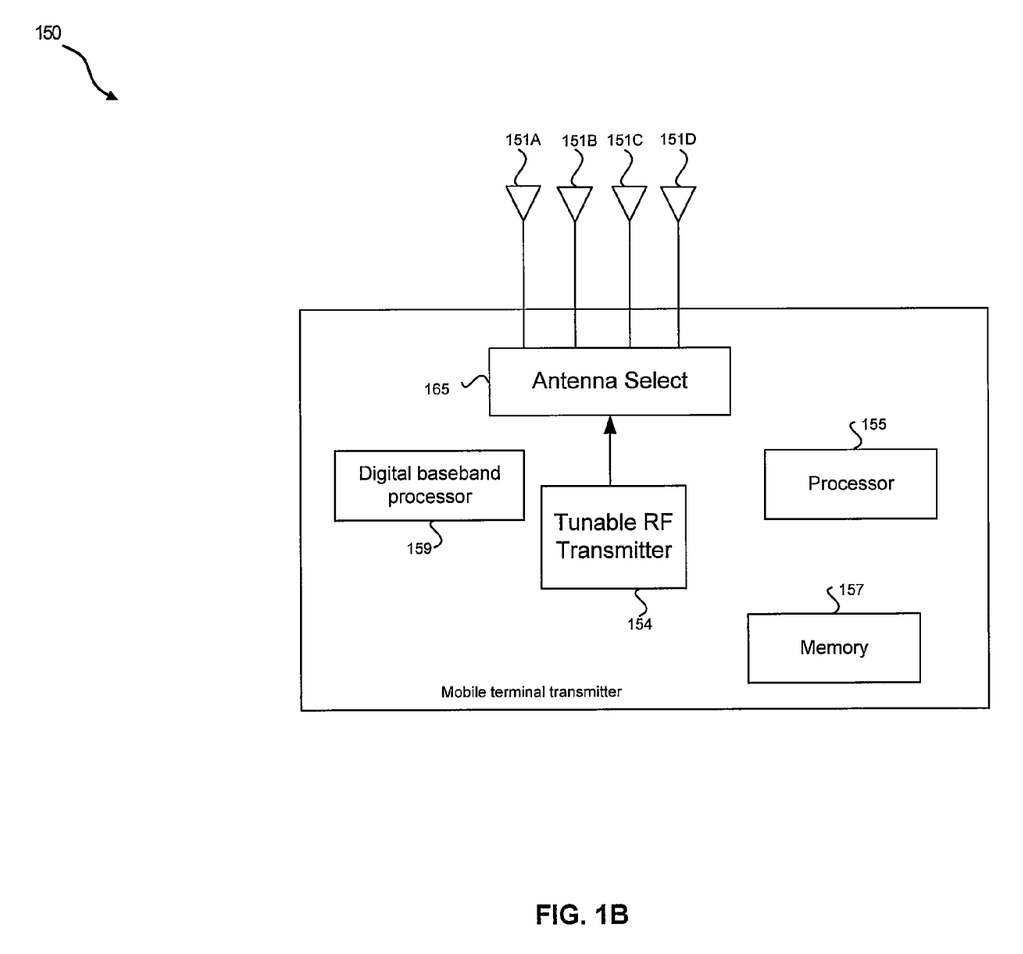
FIG. 1B is a block diagram of an exemplary multi-band mobile terminal which may utilize a single tunable output stage with selectable antennas, in accordance with an embodiment of the invention.

FIG. 1B is a block diagram of an exemplary multi-band mobile terminal which may utilize a single tunable output stage with selectable antennas, in accordance with an embodiment of the invention. Referring to FIG. 1B, there is shown mobile terminal transmitter 150 that may comprise a tunable RF transmitter 154, a digital baseband processor 159, a processor 155, a memory 157, and an antenna select block 165. An array of antennas 151A, 151B, 151C and 151D may be communicatively coupled to the antenna select block 165, with each antenna designed for a specific frequency range. The antenna select block 165 may couple an appropriate antenna to the mobile terminal 150, depending on the desired frequency.

The digital baseband processor 159 may comprise suitable logic, circuitry, and/or code that may enable processing and/ or handling of baseband signals. In this regard, the digital baseband processor 159 may process or handle signals to be transferred to the tunable RF transmitter 154 for transmission via a wireless communication medium. The digital baseband processor 159 may also provide control and/or feedback information to the tunable RF transmitter 154, based on information from the processed signals. The digital baseband processor 159 may communicate information and/or data from the processed signals to the processor 155 and/or to the memory 157. Moreover, the digital baseband processor 159 may receive information from the processor 155 and/or the memory 157, which may be processed and transferred to the tunable RF transmitter 154 for transmission to the wireless communication medium.

The tunable RF transmitter 154 may comprise suitable logic, circuitry, and/or code that may enable processing of RF signals for transmission. The tunable RF transmitter 154 may enable transmission of RF signals in frequency bands utilized by various wireless communications systems, such as Bluetooth, WLAN, GSM and/or WCDMA, for example, and as such may be frequency tunable and standard selectable.

The processor 155 may comprise suitable logic, circuitry, and/or code that may enable control and/or data processing operations for the mobile terminal 150. The processor 155 may be utilized to control at least a portion of the tunable RF transmitter 154, the digital baseband processor 159, and/or the memory 157. In this regard, the processor 155 may generate at least one signal for controlling operations within the mobile terminal 150.

The memory 157 may comprise suitable logic, circuitry, and/or code that may enable storage of data and/or other information utilized by the mobile terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the mobile terminal transmitter 150.

The antenna select block 165 may comprise suitable circuitry, logic and/or code for selectively coupling one or more of the antennas 151A, 151B, 151C, and/or 151D to the tunable RF transmitter 154. The antenna select block 165 may comprise an addressable array of transistors, for example, to switch between the antennas 151A, 151B, 151C, and/or 151D.

In operation, the tunable RF transmitter 154 may be enabled to generate an amplified RF signal. The signal may be communicated to the antenna select block 165 which may communicate the received signal to one or more of the antennas 151A, 151B, 151C and/or 151D.

Figure 2:
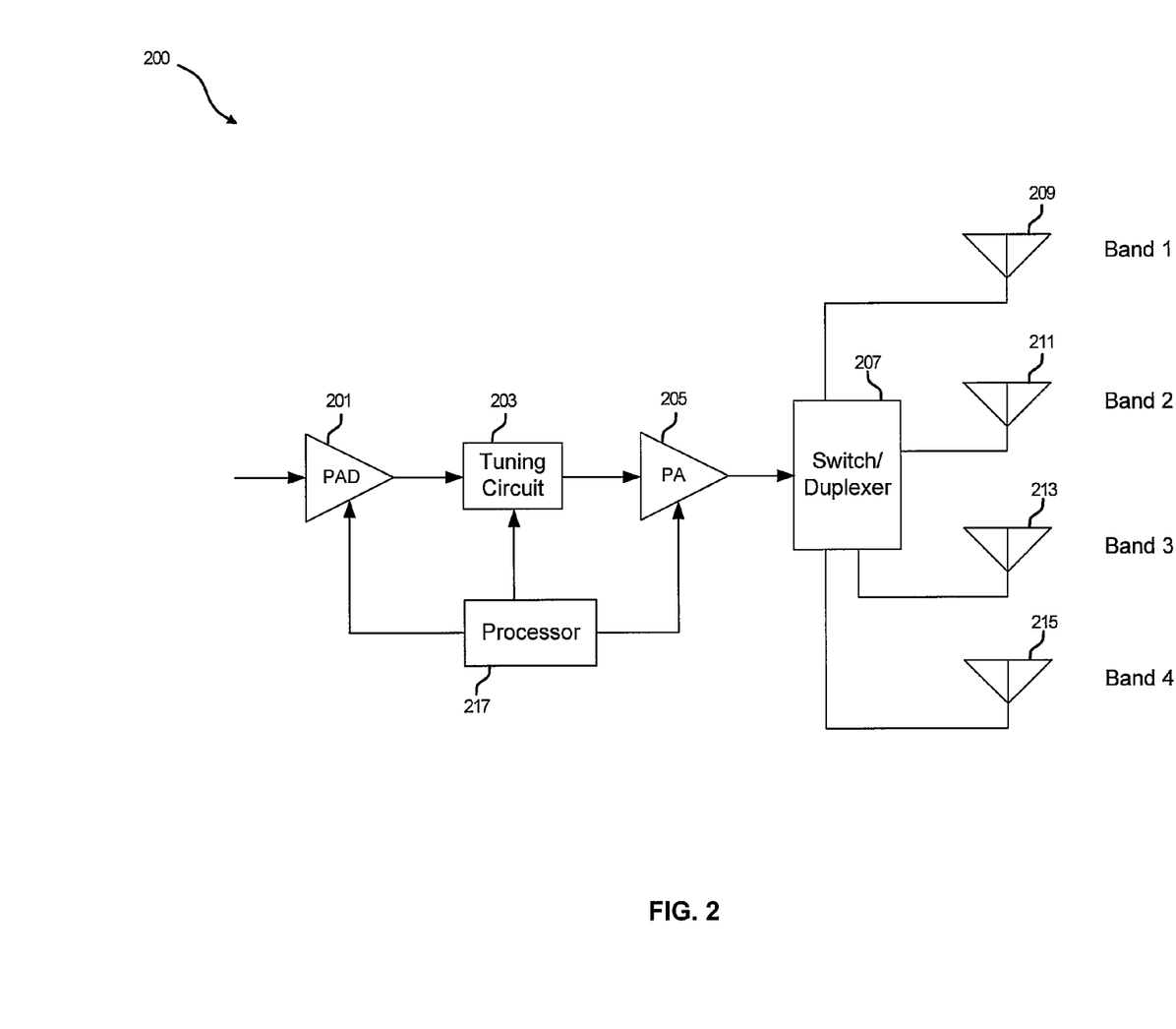
FIG. 2 is a block diagram illustrating an exemplary tunable output stage with selectable antennas, in accordance with an embodiment of the invention.

FIG. 2 is a block diagram illustrating an exemplary tunable output stage with selectable antennas, in accordance with an embodiment of the invention. Referring to FIG. 2, there is shown a tunable output stage 200 comprising a PAD 201, a tuning circuit 203, a PA 205, a switch/duplexer 207, antennas 209, 211, 213 and 215, and a processor 217.

The PAD 201 may comprise suitable circuitry, logic and/or code for receiving analog input signals and generating an output signal for driving a power amplifier. The PAD 201 may receive as inputs, control signals, which may be generated by the processor 217. The received control signal may be utilized to set a gain or attenuation level of the PAD 201. The PAD 201 may be enabled to receive the output signal generated by the baseband stages of the transmitter. The PAD 201 may be enabled to generate an output signal that may be communicated to the tuning circuit 203.

The tuning circuit 203 may comprise suitable circuitry, logic and/or code for determining the frequency band that may be communicated to the PA 205. The tuning circuit 203 may comprise selectable capacitors and inductors, described further with respect to FIG. 3, which may determine the center frequency and bandwidth of the tuning circuit 203. The frequency and bandwidth of the tuning circuit 203 may be controlled by the processor 217.

The PA 205 may comprise suitable circuitry, logic and/or code that may enable amplification of input signals to generate a transmitted signal of sufficient signal power (as measured by dBm, for example) for transmission via a wireless communication medium. The PA 205 may receive as inputs, control signals, which may be generated by the processor 217. The received control signal may be utilized to set a gain or attenuation level of the PA 205. The PA 205 may receive the output signal generated by the tuning circuit 203 and provide a gain level as determined by the output signal desired at the antenna 209, 211, 213 and/or 215. The gain level may be determined depending on the desired application standard, such as GSM, EDGE, or WCDMA, for example.

The switch/duplexer 207 may comprise suitable circuitry, logic and/or code that may enable the selection of which antenna, 209, 211, 213 or 215 may be coupled to the output of the PA 205. In addition, in instances where duplex operation may be required, such as with WCDMA, for example, the output signal generated by the PA 205 received by the switch/duplexer 207 may be communicated to a duplexer integrated within the switch/duplexer 207. In instances where duplex operation may not be required, the received signal may not pass through a duplexer and may be communicated directly to an antenna 209, 211, 213 and/or 215. The switch/duplexer 207 may be controlled by the processor 217. The switching portion of the switch/duplexer 207 may comprise a series of CMOS transistors, for example, that may be switched on or off to select an antenna to receive output signals from the PA 205. In this manner, the switch portion of the switch/duplexer 207 may be integrated with the tunable output stage 200. In instances where duplex operation may not be required, such as in EDGE/GSM, for example, a T/R switch may be incorporated in the switch/duplexer 207.

The antennas 209, 211, 213 and 215 may comprise suitable circuitry for transmitting an RF signal. Each antenna may be designed to transmit at a particular frequency and the impedance of each antenna may match the output impedance of the PA via impedance matching transformers, not shown in FIG. 2, but described with respect to FIG. 3.

The processor 217 may comprise suitable logic, circuitry, and/or code that may enable processing of binary data contained within an input baseband signal. The processor 217 may perform processing tasks, which correspond to one or more layers in an applicable protocol reference model (PRM). For example, the processor 217 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the processor 217 may be referred to as being within the digital domain. The processor 217 may also generate control signals to control the PAD 201, the tuning circuit 203, the PA 205 and/or the switch/duplexer 207 based on the processing of the input binary data.

In operation, the tunable output stage 200 may be intended for receiving an analog input signal and applying an appropriate gain to the signal such that the power transmitted by the antenna, 209, 211, 213 and/or 215 may be at a desired level. The input signal may be communicated to the PAD 201, which may provide gain or attenuation and may communicate an output signal to the tuning circuit 203. The tuning circuit 203 may be configured to pass a signal at the frequency of the output signal generated by the PAD 201. The tuning circuit 203 may generate an output signal that may be communicated to the PA 205. The PA 205 may provide gain or attenuation and communicate an output signal to the input of the switch/duplexer 207. The switch/duplexer 207 may couple a selected antenna, 209, 211, 213 or 215 to the PA 205. The selected antenna may transmit an output signal at a desired frequency and at a desired power level, −50 to +30 dBm, for example.

In this manner, a single output stage, such as the tunable output stage 200, may be utilized to transmit RF signals at a variety of selectable frequencies with a tunable bandwidth. Conventional systems may require multiple output stages to transmit at different frequencies, greatly increasing die size and power requirements. In addition, for conventional systems, T/R switches, such as the T/R switches 107A, 107B, 107C and 107D described with respect to FIG. 1A, may incur loss in the RF signal and may also significantly increase cost.

Figure 3:
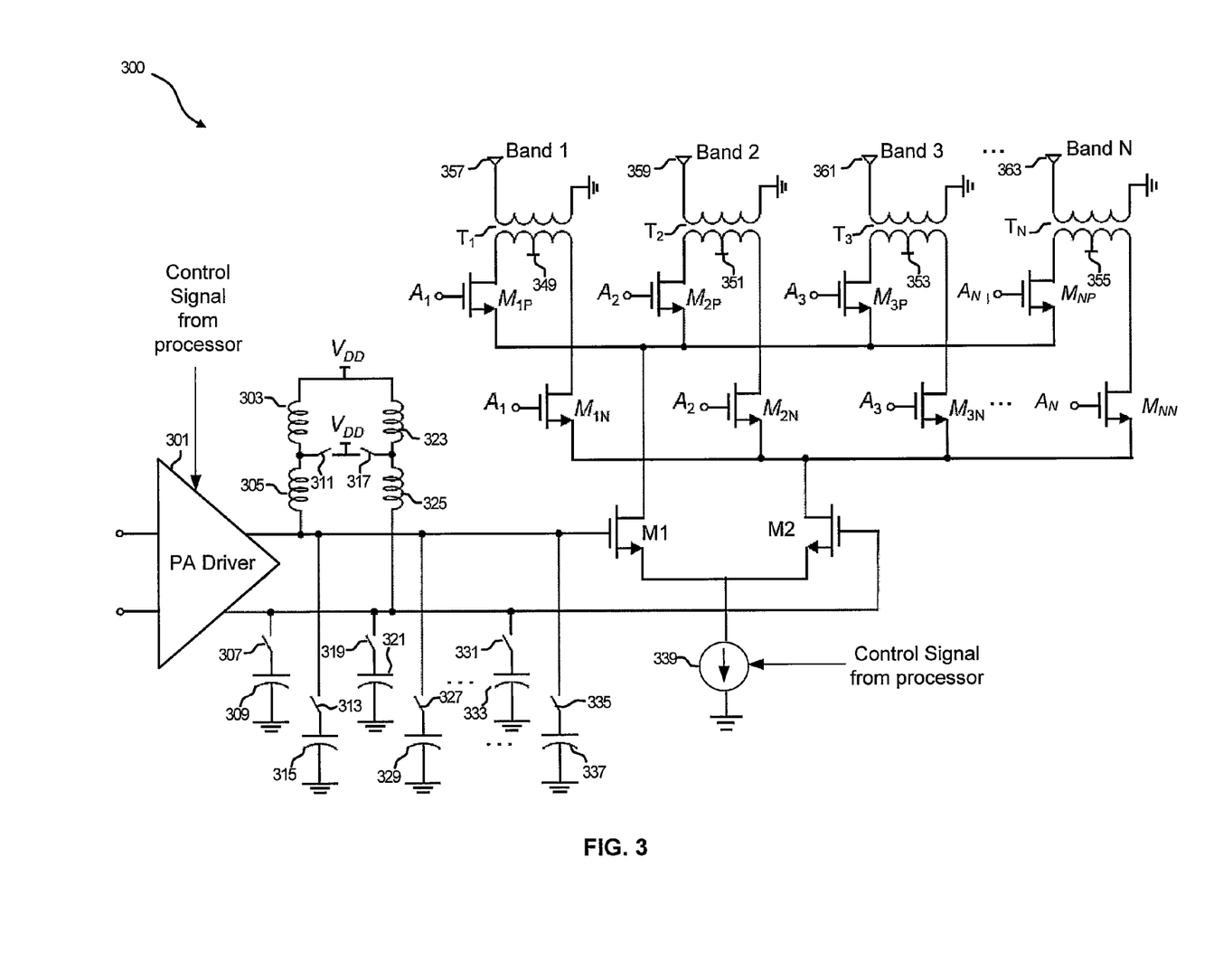
FIG. 3 is a block diagram of exemplary tunable output stage circuitry, in accordance with an embodiment of the invention.

FIG. 3 is a block diagram of exemplary tunable output stage circuitry, in accordance with an embodiment of the invention. Referring to FIG. 3, there is shown tunable output stage 300 comprising a PAD 301, inductors 303, 305, 323 and 325, capacitors, 309, 315, 321, 329, 333 and 337, switches 307, 311, 313, 317, 319, 327, 331 and 335, a current source 339, transformers $T_1$, $T_2$, $T_3$ and $T_N$, transformer center taps 349, 351, 353 and 355, antennas 357, 359, 361 and 363, power amplifier transistors M1, M2 and band switching transistors $M_{1N}$, $M_{1P}$, $M_{2N}$, $M_{2P}$, $M_{3N}$, $M_{3P}$, $M_{NN}$, and $M_{NP}$. The tunable output stage 300 may comprise N stages, where N may be determined by the frequency requirements of the system. The PAD 301 may be substantially similar to the PAD 201 described with respect to FIG. 2.

The inductors 303, 305, 323 and 325, capacitors, 309, 315, 321, 329, 333 and 337, and switches 307, 311, 313, 317, 319, 327, 331 and 335, may comprise a tuning circuit that may be configured to pass a signal of a desired frequency from the PAD 301 to the power amplifier transistors M1 and M2. The frequency may be configured by closing appropriate switches. For example, by closing switches 311 and 317, the inductors 303 and 323 are bypassed as they are shorted out with the bias voltage $V_{DD}$ applied at both ends. Thus, the effective inductance may the parallel combination of the inductors 305 and 325. In the same manner, closing any of the switches for the capacitors may result in the parallel combination of the selected capacitors. The invention is not limited in the number of inductors and/or capacitors and/or frequency bands illustrated in FIG. 3. Accordingly, the number of inductors, capacitors and/or frequency bands may be implementation dependent and may depend on, for example, the frequency requirements of the system. The number of antennas, transformers and band switching transistors may scale with the number of frequency bands.

The selection of the inductors and capacitors may be made in conjunction with the selection of the appropriate antenna. The antennas 357, 359, 361 and 363 may each be tuned to operate at a specific frequency range, as indicated by Band 1, Band 2, Band 3 and Band N. The antenna may be selected by providing a signal, $A_1, A_2, A_3$ and/or $A_N$ from a processor such as the processor 217 described with respect to FIG. 2, to the appropriate transistors, $M_{1N}$, $M_{1P}$, for the antenna 357, or $M_{2N}$, $M_{2P}$, for the antenna 359, for example. In one embodiment of the invention, the transistors $M_{1N}$, $M_{1P}$, $M_{2N}$, $M_{2P}$, $M_{3N}$, $M_{3P}$, $M_{NN}$, and $M_{NP}$ are n-channel MOSFETs, which may be switched on by applying a high bias at the gate terminal of the transistor. Thus, to transmit a signal in Band 3 utilizing the antenna 361, $A_3$ may be asserted high.

The impedance of the antennas 357, 359, 361 and 363 may be matched to the output impedance of the amplifier comprising M1 and M2 and associated switching transistors $M_{1N}$, $M_{1P}$, $M_{2N}$, $M_{2P}$, $M_{3N}$, $M_{3P}$, $M_{NN}$, and $M_{NP}$ via the transformers $T_1$, $T_2$, $T_3$ and $T_N$. For power amplifier applications, the power amplifier transistors M1 and M2, may have a large area to handle the high power levels required, thus their output impedance may be low, on the order of a few ohms, for example. To match the output impedance of the circuit utilized for Band 3, for example, comprising transistors M1, M2, $M_{3N}$, $M_{3P}$, with that of the antenna 361, which may 50 ohms, for example, the transformer $T_3$ may be designed with a number of turns to step-up the impedance appropriately.

The current source 339 may comprise suitable circuitry, logic and/or code that may be enabled to supply current to the power amplifier circuit comprising M1, M2 and the combination of $M_{1N}$ and $M_{1P}$, $M_{2N}$ and $M_{2P}$, $M_{3N}$ and $M_{3P}$, up to $M_{NN}$, and $M_{NP}$. In one embodiment of the invention, the current source may comprise a series of parallel-connected current mirrors of varying current capacity. By selecting appropriate current mirrors using a processor, such as the processor 217 described with respect to FIG. 2, the biasing conditions of the circuit may be adjusted, thus controlling the transmitted power of the tunable output stage 300.

In addition, the biasing conditions of the tunable output stage 300 may be adjusted by varying the voltage applied to the transformer center taps 349, 351, 353 and 355. Since an inductor may simply be a short circuit at DC, this applied voltage may represent the bias voltage for the power amplifier comprising the power amplifier transistors M1, M2 and the appropriate transistors $M_{1N}$ and $M_{1P}$, $M_{2N}$ and $M_{2P}$, $M_{3N}$ and $M_{3P}$, up to $M_{NN}$, and $M_{NP}$. The bias voltage may be adjusted by a DC to DC converter, for example, which may be controlled by a processor, such as the processor 217, described with respect to FIG. 2.

In operation, a frequency band to be transmitted by the tunable output stage 300 may be selected by a processor, such as the processor 217, described with respect to FIG. 2. The selected frequency may determine which capacitors 309, 315, 321, 329, 333 and 337 and which inductors 303, 305, 323 and 325 may be switched into the circuit, and which antenna 357, 359, 361, or 363 may be activated. The PAD 301 may receive an input signal at the selected frequency and provide appropriate gain determined by the above-mentioned processor.

The tuning circuit may be configured such that the capacitors and inductors switched on may generate a frequency response that passes a signal at the appropriate frequency. The signal may then be communicated to the power amplifier transistors M1 and M2. Due to the low impedance of the power amplifier transistors M1 and M2, the current may be high while the voltage may be low. In this manner, the bias voltage requirements applied to the transformer center taps 349, 351, 353 and/or 355 may not be high. The voltage may be stepped up by the transformers $T_1$, $T_2$, $T_3$ to $T_N$ resulting in suitable voltage levels on the antenna, such as the antennas 357, 359, 361 and/or 363.

The biasing conditions for the power amplifier transistors M1 and M2, defined by the current source 339 and the voltage applied to the center taps 349, 351, 353 and 355 of the transformers $T_1$, $T_2$, $T_3$ to $T_N$, may determine the class of operation of the amplifier, such as Class A, AB, C, and F for example. The class of operation may be adjusted depending on the standard required for the transmission application, including GSM, WCDMA and/or EDGE, for example.

A power amplifier (PA) circuit may be biased for different modes, or "classes" of operation. For example, in Class A operation, a PA may be biased such that the PA is in a conducting, or ON, state during 100% of the cycle, or the entire cycle, of the input signal. The bias level is also typically selected such that the PA operates in the most linear portion of the transfer curve, which characterizes the PA circuit. In Class A operation, the output signal from the PA is typically a scaled version of the input signal, where the scaling factor is a function of the gain associated with the PA circuit. However, because of the bias level utilized for Class A operation, the PA is typically in a conducting state even when there is no input signal. Furthermore, even when the PA is amplifying an input signal, the efficiency of the PA may not exceed 50%. For example, each watt of delivered output power, or Pout, may require two (2) watts of delivered power, PDC, from a DC power supply source (such as a battery).

In Class B operation, a PA may be biased such that the PA is in a conducting state during 50%, or half, of the cycle of the input signal. This may result in large amounts of distortion of the input signal in the output signal. In this regard, in Class B operation, the PA may operate in a nonlinear portion of the transfer curve. However, the theoretical efficiency of a Class B PA circuit may reach 78.5%. The higher efficiency of the Class B PA results from the PA being in a non-conducting, or OFF, state half of the time. While the PA is in the OFF state, power dissipation may be theoretically zero (0).

In Class AB operation, a PA may be biased such that the PA is in a conducting state for greater than 50%, but less than 100%, of the cycle of the input signal. In Class C operation, a PA may be biased such that the PA is in a conducting state for less than 50% of the cycle of the input signal.

Figure 4:
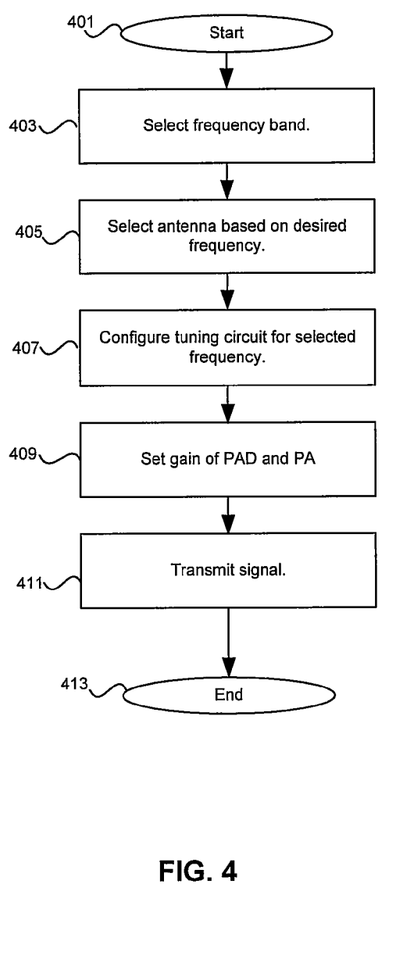
FIG. 4 is a flow diagram illustrating exemplary steps in the control of a tunable output stage with selectable antennas, in accordance with an embodiment of the invention.

FIG. 4 is a flow diagram illustrating exemplary steps in the control of a tunable output stage with selectable antennas, in accordance with an embodiment of the invention. Referring to FIG. 4, in step 403 the desired frequency of transmission may be selected. In step 405, an appropriate antenna 357, 359, 361, or 363 may be selected that may be designed to transmit at the desired frequency. In step 407, the tuning circuit 203 may be configured to adjust the frequency pass band to center on the desired frequency. In step 409, the gain of the PAD 201 and PA 205 may be set depending on the desired application standard, such as GSM, EDGE, WCDMA, for example. In step 411, the signal may be transmitted, followed by the end step 413.

In an embodiment of the invention, a single programmable output stage 300 of a transmitter may be configured to transmit a signal via one or more of a plurality of selectively coupled antennas 357, 359, 361 and/or 363, wherein each antenna handles signals in a different frequency band. A power amplifier comprising the power amplifier transistors M1 and M2 within the single programmable output stage 300 may be tuned to a frequency within a range of frequencies handled by the selectively coupled antenna or antennas 357, 359, 361 and/or 363. The tuning may be accomplished by programmably adjusting at least one inductance, 303, 305, 323 and/or 325 and capacitance 309, 315, 321, 329, 333 and/or 337. The antennas 357, 359, 361 and 363 may be impedance matched to the power amplifier transistors M1 and M2 using transformers $T_1$, $T_2$, $T_3$ to $T_N$, and may be activated by at least one pair of integrated transistors, $M_{1N}$ and $M_{1P}$, $M_{2N}$ and $M_{2P}$, $M_{3N}$ and $M_{3P}$, and/or $M_{NN}$, and $M_{NP}$. The power amplifier transistors M1 and M2 may be biased in a class of operation, which may include Class A, AB, C and F, and may be biased utilizing a digitally-controlled current source 339 and a digitally-controlled voltage source at transformer center taps 349, 351, 353 and 355.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for controlling signals m a circuit, the method comprising:
    configuring a single programmable output stage of a transmitter to handle the transmission of a signal via one of a plurality of antennas selectively coupleable to said programmable output stage, wherein each of said plurality of antennas handles signals in a different frequency band and said single programmable output stage comprises a power amplifier tunable to a frequency within a range of frequencies;
    biasing said power amplifier within said single programmable output stage based on a class of operation, said class of operation comprising class A, AB, C and F; and
    selectively coupling one of said plurality of antennas to said single programmable output stage for said transmission of said signal.

2. The method according to claim 1, wherein said tuning comprises programmably adjusting at least one of: an inductance and a capacitance of said single programmable output stage.

3. The method according to claim 1, comprising impedance matching each of said plurality of antennas to said power amplifier within said single programmable output stage using transformers.

4. The method according to claim 1, comprising enabling said selectively coupled one of said plurality of antennas.

5. The method according to claim 4, comprising activating at least one integrated transistor for said enabling said selectively coupled one of said plurality of antennas.

6. The method according to claim 1, comprising biasing said power amplifier integrated within said programmable output stage utilizing a digitally-controlled current source.

7. The method according to claim 1, comprising biasing said power amplifier integrated within said programmable output stage utilizing a digitally-controlled voltage source.

8. A system for controlling signals in a circuit, the system comprising:
    one or more circuits for configuring a single programmable output stage of a transmitter to handle the transmission of a signal via one of a plurality of antennas selectively coupleable to said programmable output stage, wherein each of said plurality of antennas handles signals in a different frequency band;
    said one or more circuits tunes a power amplifier in said single programmable output stage to a frequency within a range of frequencies handled by said selectively coupled one of said plurality of antennas;
    said one or more circuits biases said power amplifier within said single programmable output stage based on a class of operation, said class of operation comprising class A, AB, C and F; and said one or more circuits selectively couples one of said plurality of antennas to said single programmable output stage for said transmission of said signal.

9. The system according to claim 8, wherein said one or more circuits programmably adjusts at least one of: an inductance and a capacitance of said single programmable output stage.

10. The system according to claim 8, wherein said one or more circuits impedance matches said plurality of antennas with aid power amplifier within said single programmable output stage using transformers.

11. The system according to claim 8, wherein said one or more circuits enables said selectively coupled one of said plurality of antennas.

12. The system according to claim 11, wherein said one or more circuits activates at least one integrated transistor for said enabling said selectively coupled one of said plurality of antennas.

13. The system according to claim 8, comprising one or more circuits for biasing said power amplifier integrated within said programmable output stage utilizing a digitally-controlled current source.

14. The system according to claim 8, comprising one or more circuits for biasing said power amplifier integrated within said programmable output stage utilizing a digitally-controlled voltage source.

15. A non-transitory machine-readable storage having stored thereon, a computer program having at least one code section for controlling signals in a circuit, the at least one code section being executable by a machine for causing the machine to perform steps comprising:
    configuring a single programmable output stage of a transmitter to handle the transmission of a signal via one of a plurality of antennas selectively coupleable to said programmable output stage, wherein each of said plurality of antennas handles signals in a different frequency band;
    tuning a power amplifier in said single programmable output stage to a frequency within a range of frequencies handled by said selectively coupled one of said plurality of antennas;
    biasing said power amplifier within said single programmable output stage based on a class of operation, said class of operation comprising class A, AB, C and F; and
    selectively coupling one of said plurality of antennas to said single programmable output stage for said transmission of said signal.

16. The machine readable storage according to claim 15, wherein said at least one code section comprises code for programmably adjusting at least one of: an inductance and a capacitance of said single programmable output stage.

17. The machine readable storage according to claim 15, wherein said at least one code section comprises code for impedance matching said plurality of antennas with said power amplifier within said single programmable output stage using transformers.

18. The machine readable storage according to claim 15, wherein said at least one code section comprises code for enabling said selectively coupled one of said plurality of antennas.

19. The machine readable storage according to claim 18, wherein said at least one code section comprises code for activating at least one integrated transistor for said enabling said selectively coupled one of said plurality of antennas.

20. The machine readable storage according to claim 15, wherein said at least one code section comprises code for biasing said power amplifier integrated within said programmable output stage utilizing a digitally-controlled current source.

21. The machine readable storage according to claim 15, wherein said at least one code section comprises code for biasing said power amplifier integrated within said programmable output stage utilizing a digitally-controlled voltage source.

* * * * *